United States Patent

Epstein

[15] 3,664,874

[45] May 23, 1972

[54] TUNGSTEN CONTACTS ON SILICON SUBSTRATES

[72] Inventor: Joseph Epstein, Baltimore, Md.

[73] Assignee: The United States of America as represented by the Administrator of the National Aeronautics and Space Administration

[22] Filed: Dec. 31, 1969

[21] Appl. No.: 889,422

[52] U.S. Cl. ....................136/89, 29/198, 117/200

[51] Int. Cl. ....................H01l 15/02

[58] Field of Search ....................136/89, 237; 117/200, 217; 29/198

[56] References Cited

UNITED STATES PATENTS

| | | | |
|---|---|---|---|
| 3,375,418 | 3/1968 | Garnache et al. | 136/89 UX |
| 3,338,753 | 8/1967 | Horsting | 136/237 |
| 3,411,050 | 11/1968 | Middleton et al. | 136/89 X |
| 3,483,039 | 12/1969 | Gault | 136/89 |
| 3,515,583 | 6/1970 | Inoue et al. | 117/200 |
| 3,519,479 | 7/1970 | Inoue et al. | 117/200 |
| 3,523,832 | 8/1970 | Pupprecht et al. | 136/237 X |
| 3,504,325 | 3/1970 | Rairden | 117/107 X |

*Primary Examiner*—Allen B. Curtis

*Attorney*—R. F. Kempf, E. Levy and G. T. McCoy

[57] ABSTRACT

Disclosed are a process whereby tungsten contact electrodes are formed on doped silicon substrates, such as integrated circuit chips and solar cells, and the resultant products. The method comprises depositing elemental tungsten on contact areas of doped silicon semiconductor devices, and thereafter processing the silicon devices to induce a chemical reaction between the tungsten and the silicon. The resulting tungsten contact electrodes thereby include a transition region at the interface of the tungsten electrode and silicon device comprising tungsten-silicon compounds which are physically and chemically bonded to, and form an integral part of, both the tungsten electrode material and the silicon semiconductor material. A lead is bonded directly to the tungsten electrode.

10 Claims, 3 Drawing Figures

INVENTOR,
JOSEPH EPSTEIN

BY [signature]
[signature] ATTORNEYS

TUNGSTEN CONTACTS ON SILICON SUBSTRATES

ORIGIN OF THE INVENTION

The invention as described herein was made by an employee of the United States Government and may be manufactured and used by or for the Government for Governmental purposes without the payment of any royalties thereon or therefor.

The present invention relates to a method of forming tungsten contact electrodes on silicon substrates and the resultant products. More particularly, the invention relates to a method of forming tungsten contact electrodes on silicon substrates by chemically reacting the tungsten electrode material with the silicon substrate, and to the products formed by the method, whereby the semiconductor devices do not require additional passivation subsequent to the formation of the tungsten contact electrodes thereon.

The ultimate utilization of semiconductor devices requires that contact electrodes be attached to various parts of the semiconductor material. The contact electrodes frequently must have the ability to withstand extreme environmental operating conditions of temperature, humidity, vacuum and radiation without adversely affecting the original characteristics of the semiconductor device. For many applications, it is also necessary for these contact electrodes to be ohmic, i.e., non-rectifying, and to have low contact-to-surface resistance. Furthermore, the process of making the contact electrodes should not degrade the characteristics of the semiconductor device.

Heretofore, many semiconductor contact electrodes, particularly contact electrodes on silicon devices, have not adequately possessed these properties with resulting deleterious effects on the operation of the devices.

One of the main causes of contact electrode failure occurs as a result of the type of surface adhesive bonding employed to bond the metal electrode to the semiconductor surface. One surface bonding technique involves providing an adhesive layer or substance between the contact electrode material and the supporting semiconductor, while another employs spring-type means to force the contact electrode against the semiconductor surface. Due to the different physical characteristics of the contact electrode and semiconductor materials, extremes in temperature, for example, cause different expansion and/or contraction of the contact electrode material with respect to the semiconductor material. This unequal flexing results in the physical separation of the contact electrode from the semiconductor surface, and a consequent increase in contact-to-surface resistance which causes the dissipation of useful electrical energy as heat or, in extreme cases, a completely open circuit.

An early prior art attempt to provide an acceptable contact electrode for semiconductor devices involved the use of a buffer layer physically located between the semiconductor material and the metal contact electrode. The buffer material has a temperature coefficient of expansion intermediate the temperature coefficient of the contact electrode material and the semiconductor material. The buffer layer provides expansion-contraction compliance between the semiconductor material and the contact electrode material, and provides some degree of success in preventing contact electrode separation from the semiconductor surface in high and low temperature environments. However, in some special applications involving environmental extremes, this buffer layer still does not completely solve the contact electrode separation problem.

Another solution involves the use of a laminated type of contact electrode including a buffer layer, wherein a heat induced sintered region is formed between the contact electrode material and the semiconductor material. The sintered regions are formed by a process of solid state recrystallization, that is, the contact electrode material is placed on the semiconductor material and both are heated to cause a softening at a common interface. Heating causes atoms in the crystal structure of each to loosen so that when the heat is removed some of the atoms of both the contact electrode material and the semiconductor material physically comingle with the atoms of the other. Thus, upon recrystallization of the contact electrode and the semiconductor materials, a surface adhesive type contact is formed by virtue of the comingling of the atoms of each. This type of laminated contact electrode structure involving the buffer layer and the sintered region does not completely give the desired result because it still provides no more than a surface adhesive type bond between the contact electrode material and the semiconductor material, and is therefor susceptible to the above-mentioned deficiencies of that type of contact electrode.

Another main cause of contact electrode failure has been the failure to use contact electrode materials, which are, when adhered to the semiconductor device, able to withstand the extreme environmental conditions to which the contact electrodes will be subjected. One material which will withstand the extreme environmental conditions of temperature, humidity, vacuum and radiation, particularly X-rays, is tungsten. Elemental tungsten, a refractory metal, has a relatively high melting point, an acceptable low electrical resistivity, and a sufficient density to enable it to perform as a high Z material, i.e., an X-ray shield. A further property of tungsten, useful in contact electrodes, is that it combines with silicon to form stable compounds having low electrical resistance and high resistance to radiation. A major drawback in the prior uses of tungsten as a contact electrode has been the fact that tungsten, as a refractory metal, is extremely susceptible to oxidation, and will form oxides at relatively low temperatures, i.e. below 450° C. Such oxide layers are difficult to work with, and must be removed from such contact electrodes when leads are made to the tungsten electrode. Prior art processes for attaching tungsten electrodes to semiconductor devices have necessitated passivation steps with the danger of oxidizing the tungsten contact. Such oxidation layers are insulators and undesirable in contact electrodes.

In accordance with the present invention, a method of forming tungsten contact electrodes on silicon substrates, e.g., on integrated circuit substrates or chips and silicon solar cells, and the resulting products are disclosed. The process involves chemically reacting the tungsten contact electrode material and the silicon to form interelemental compounds of tungsten and silicon in the region of the tungsten contact silicon substrate interface. The process obviates the need for passivation of the semiconductor device subsequent to formation of the tungsten electrode on the substrate. Therefore, the tungsten electrode is not subject to oxidation during such a passivation, and a lead may be attached directly to the tungsten electrode without any intervening steps to remove undesirable, insulating oxide coatings. The resulting tungsten contact electrode is a tenacious, low resistant contact, which is capable of operating in the environmental extremes of temperature, humidity, vacuum and radiation. The method of the present invention obviates the use of the inferior surface adhesive type of contact electrodes by providing a tungsten contact electrode for silicon substrates which includes a transition region between the contact electrode and silicon substrate. In the interface region, there are interelemental compounds of tungsten and silicon which are physically and chemically bonded to, both the contact electrode and the semiconductor material. The interelemental compounds extend into the electrode and semiconductor materials to increase the contact volume of the interface and thereby enhance the contact stability. The formation of interelemental compounds produces a highly conductive interface region between the silicon semi-conductor and the tungsten contact.

Accordingly, it is an object of this invention to provide a highly reliable, ohmic, stable and low resistant contact electrode for semiconductor devices.

It is another object of this invention to provide a tungsten contact electrode for silicon semiconductor devices which avoids the use of a surface adhesive type bond between the contact electrode tungsten and the silicon device.

It is another object of this invention to provide a method of forming a highly reliable, ohmic, and stable tungsten contact electrode having low contact-to-surface resistance on a silicon semiconductor substrate, whereby the semiconductor devices do not require additional passivation subsequent to the formation of the tungsten contact electrode and leads may be immediately adhered directly to the electrode.

It is another object of this invention to provide a method of forming tungsten contact electrodes on silicon substrates which are highly resistant to vacuum, temperature, humidity and radiation extremes.

It is another object of this invention to provide a method of forming tungsten metallization electrodes on silicon integrated circuit substrates which include the formation of tungsten-silicon compounds as part of the metallization electrodes.

It is another object of this invention to provide a method of forming tungsten collector electrodes on silicon solar cells which include the formation of tungsten-silicon compounds as part of the tungsten collector electrodes.

The above and still further objects, features and advantages of the present invention will become apparent upon consideration of the following detailed description of two specific embodiments thereof, especially when taken in conjunction with the accompanying drawings wherein.

Figure 1:
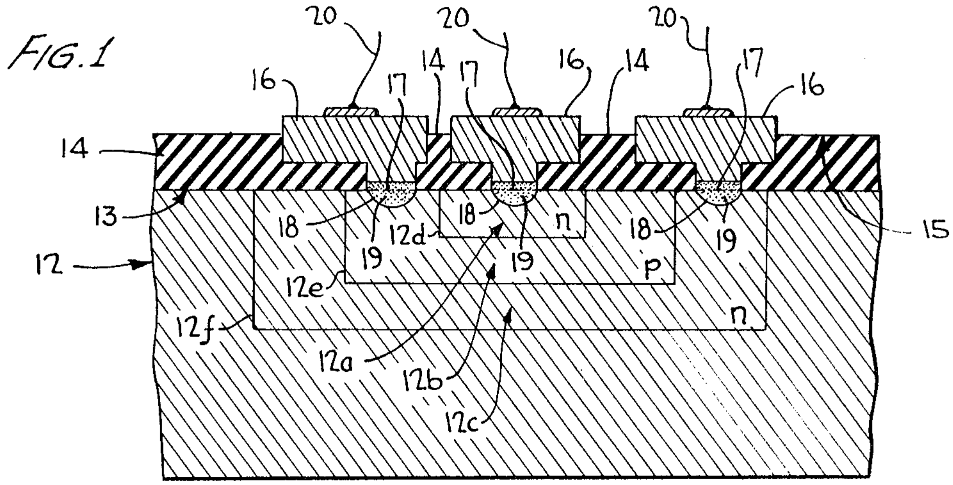
FIG. 1 is a view of part of a silicon integrated circuit substrate including a tungsten contact electrode formed by the method of the present invention.

Reference is now made to FIG. 1 wherein is illustrated a silicon integrated circuit substrate or chip including a tungsten metallization contact electrode formed according to the method of the present invention. The integrated circuit substrate or chip may be any standard diffused silicon integrated circuit prepared actively by having PN junctions diffused therein and then passivated. Processes for fabricating such diffused silicon integrated circuits are well known and form no part of this invention. Diffused silicon substrate or chip 12 includes diffused areas **12*a*, 12*b* and 12*c* which are doped with N type, P type and N type semiconductor impurities, respectively, to form rectifying junctions 12*d*, 12*e* and 12*f* between the areas. The silicon substrate 12 further includes a silicon dioxide passivation layer 14 formed on its surface 13 to prevent contamination of the silicon material and to electrically insulate individual tungsten contact electrodes 16 from each other on the surface 13 of substrate 12. The substrate or chip 12 further includes tungsten metallization and interconnection contact electrodes 16 which are electrically connected to external circuits by means of leads 20. The tungsten metallization electrodes 16 are formed in accordance with the method of the present invention, so that interelemental compounds 19 of tungsten and silicon are formed at the contact junction interfaces 17 between the tungsten metallization electrode 16 and the diffused silicon area 12*a*, 12*b* and 12*c*. Thus, regions 18 of interelemental compounds of tungsten and silicon are thereby physically and chemically bonded to, and form an integral part of, both the tungsten metallization electrode 16 and the silicon diffused areas 12*a*, 12*b* and 12*c* of substrate 12**.

The process of the present invention, whereby tungsten metallization electrodes are formed on silicon substrates such as the integrated circuit chip 12 of FIG. 1, involves an initial step of masking the surface 15 of silicon dioxide passivation layer 14 on the chip 12 with a standard masking material or technique to define a desired metallization configuration thereon, such as at contact junction interfaces 17. The silicon chip 12 will have been previously passivated and will therefore include silicon dioxide passivation layer 14. Next the unmasked contact junction interfaces 17 are prepared to receive the tungsten metallization material 16. Such preparation usually involves removing any passivation or contaminating coatings such as silicon dioxide layer 14 from the unmasked areas 17. For example, the removal may be accomplished by polishing, sandblasting, lapping or chemically etching the unmasked areas. Of course, during the removal preparation step, notice will be taken of the particular dimensions of the individual diffused layers **12*a*, 12*b* and 12*c*, and care will be taken not to damage any of such diffused layers. Normally, removal of from 1 to 3 hundreds of a micron from the contact junction interfaces 17 is sufficient. The preparation continues with the roughening of the unmasked contact junctions 17 so that the tungsten metallization electrode material 16 will more easily adhere thereto. Finally, the unmasked areas are degreased and cleaned by well known techniques, none of the contact junction interfaces 17 being removed in this preparation step. The tungsten metallization electrode material 16 is next deposited by a process of vacuum evaporation on the unmasked, prepared contact junction interfaces 17**.

Vacuum evaporation involves placing the masked, prepared silicon substrate or chip 12 into a highly evacuated, e.g. $10^{-7}$ torr, chamber such as a bell jar (not shown) with a supply of tungsten to be evaporated. A heater raises the temperature of the tungsten sufficiently to vaporize, and the evaporated tungsten molecules migrate to the unmasked junction interfaces 17 of the chip 12. Enough tungsten is evaporated to deposit relatively thick tungsten electrodes 16 of approximately several microns on the chip surface 13. The amount of tungsten deposited is relatively large with respect to the usual metallization electrode due to the fact that sufficient tungsten must be provided for reaction with the silicon, for providing strength and stability in the electrode structure, for shielding the underlying contact and silicon substrate from damaging radiation, particularly X-rays, and for providing sufficient electrode surface area to facilitate the connection of external circuit leads thereto, as at 20. The chip 12 is usually heated during the evaporation process to promote adhesion between contact junction interfaces 17 and the deposited tungsten electrodes 16. The high vacuum permits the tungsten to be evaporated quickly and at a relatively low temperature with respect to its melting point, and further avoids the possibility of contaminating the tungsten electrode or silicon chip by gases which might be in the air. As previously pointed out, tungsten is a refractory metal and, therefore is highly susceptible to oxidation. The present process, involving the formation of tungsten contact electrodes on previously passivated silicon substrates in a highly evacuated environment, prevents the undesirable effect of oxidizing the tungsten metal during formation of the electrode. Therefore, the completed silicon device does not require subsequent passivation and leads 20 may be directly attached to electrode 16 without the previous removal of any oxidation layer. The attachment may be made, for example, by inert gas welding, arc welding, resistance welding or soldering.

The deposition process, for example, may also be accomplished by such other techniques as vapor deposition, sputtering, compression bonding or diffusion bonding to deposit the required amount of tungsten metallization electrode material onto chip 12 in the desired metallization configurations 16.

Finally, to complete the fabrication of the tungsten metallization electrodes 16, silicon integrated circuit chip 12, having tungsten metallization material 16 deposited thereon, is annealed. The annealing induces and promotes a chemical reaction between the tungsten metallization material 16 and silicon adjacent contact junction interfaces 17 to form regions 18 of intermetallic compounds of tungsten and silicon 19. These intermetallic compounds are an integral part of both the tungsten metallization electrodes 16 and the silicon diffused regions **12*a*, 12*b* and 12*c***.

The dimensions, properties and characteristics of the tungsten-silicon compound regions 18 are determined by the conditions existing in the annealing environment. For example, tungsten metallization deposits 16 and the silicon surface junction areas 17 show evidence of softening when heated to temperatures of approximately 900° C.; however, no signs of a complete chemical reaction are present. The time required to react tungsten and silicon at these low temperatures is prohibitively long, if it occurs at all. An incomplete reaction between the tungsten and silicon results in the formation of irregular and nonuniform contact electrodes, which exhibit high contact surface resistance and which separate easily from the substrate.

In accordance with this invention, when silicon chip 12 having tungsten metallization electrode material 16 thereon is annealed at temperatures in excess of 1,300° C., and preferably in the range of 1,350° to 1,385° C., a complete reaction between the tungsten and the silicon occurs. The gradation and depth to which the tungsten-silicon compound regions 18 extend into diffused areas 12*a*, 12*b* and 12*c* and into metallization electrode 16 is accurately controlled by the annealing period. Annealing periods of from 5 to 20 minutes, at temperatures of 1,350° C. through 1,385° C., are sufficient to permit the tungsten-silicon reaction to permeate to depths of from 1 to 3 microns into the diffused areas 12*a*, 12*b* and 12*c* and into tungsten metallization electrode 16. Under these conditions the tungsten has completely reacted with the silicon in these regions. Annealing temperatures above and periods longer than the specified ones do not appreciably increase the completeness of the reaction or the quality of the contact electrode. Furthermore, caution must be exercised not to anneal for too long a period or at too high a temperature because the tungsten-silicon compounds must not permeate to the diffused PN junctions of the substrate.

X-ray analysis indicate that the interelemental compound regions 18, when annealed according to the above conditions, possess gradations comprising tungsten, $WSi_2$, $W_5Si_{12}$, $W_{14}Si_{30}$ and Si. Furthermore, experimental results indicate that, by annealing as described above, the various tungsten-silicon compounds are formed with different molecular weights. It appears that an order of increasing and decreasing molecular weight compounds are provided such that the compounds having a molecular weight most similar to that of tungsten are formed nearest the elemental tungsten and those compounds having a molecular weight similar to that of silicon are formed nearest the silicon substrate. The experimental results further indicate that the compounds having different molecular weights also possess different temperature coefficients of expansion which apparently solve the expansion-contraction problem inherent when different materials interface under changing environmental conditions.

It has been found that the normal impurity diffusion elements, such as boron and phosphorus, which will be present in the diffused areas 12*a*, 12*b* and 12*c* of the silicon chip 12 do not noticeably affect the tungsten metallization electrode 16. It appears that this is attributable to the fact that such elements are minority carriers and, therefore, are not present in sufficient quantities to participate in a noticeable reaction.

The resulting tungsten metallization electrodes 16 prepared by the method of this invention thus include integrally formed tungsten-silicon transition regions 18 which are uniform across the entire contact junction interfaces 17, and which are highly impervious to environmental extremes such as humidity, vacuum, temperature and radiation. The tungsten metallization electrode 16 provides an extremely low contact resistance and ohmic contact which enhances the electrical power output and efficiency of the silicon integrated circuit device. Further, a tungsten electrode is formed on a previously passivated silicon substrate by a process which obviates the formation of an oxidation coating on the tungsten material surface. By virtue of this process, subsequent passivation of the silicon substrate is unnecessary, and, therefore, the possibility that the tungsten electrode will be oxidized is avoided. Leads may be attached directly to the tungsten electrode.

Figure 2:
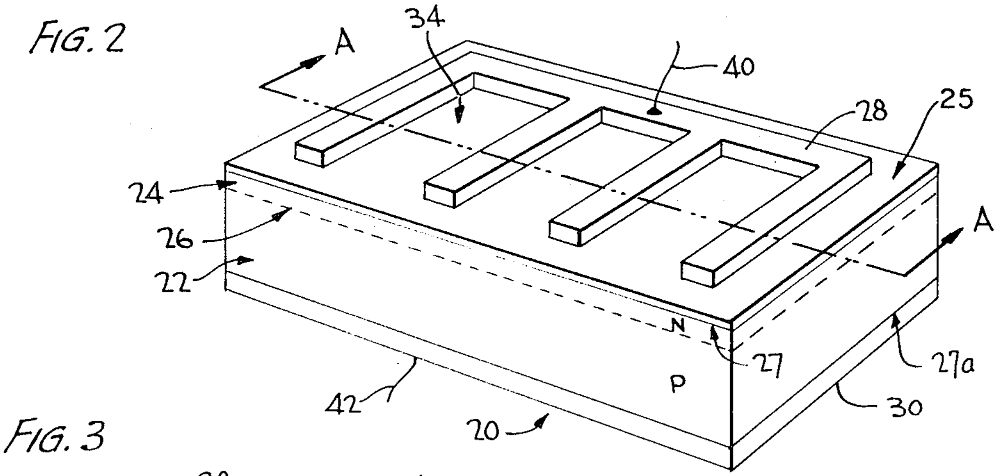
FIG. 2 is a perspective view of a silicon solar cell including tungsten collectors formed according to the method of the present invention.
Figure 3:
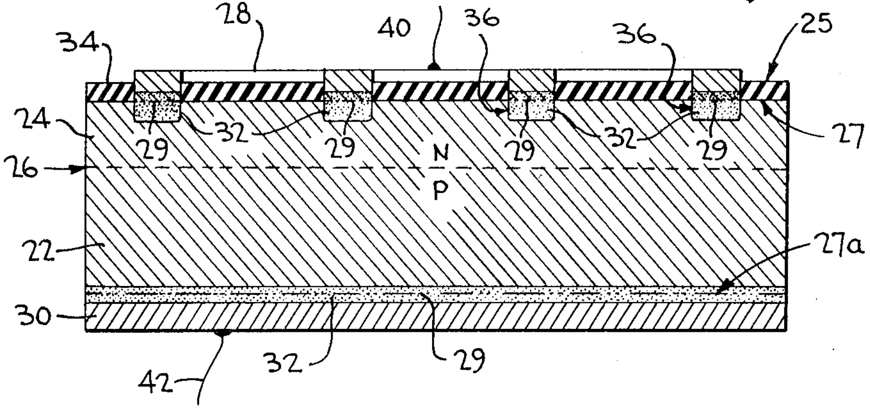
FIG. 3 is a section taken along line *a—a* of FIG. 2.

Referring now to FIGS. 2 and 3, there are illustrated diffused silicon solar cell 20 having tungsten collector electrodes 28 and 30 formed thereon in accordance with the method of the present invention. Silicon solar cell 20 includes a P-type silicon body 22 having an N-type skin layer 24 thereon to define a PN junction 26 therebetween. Impurity elements such as boron and phosphorus are diffused into silicon wafer 20 to form the PN junction 26 by well known techniques which form no part of this invention. The drawings are not to scale, and normally the PN junction 26 is approximately 3 microns below the surface 27 of the cell 20. Cell 20 includes an oxide passivated layer 34 on its surface, e.g. at 27, and tungsten collector electrodes 28 and 30 on its front and back surfaces supporting electrical connections 40 and 42, respectively. The connections may be any form of leads such as bus type connections, for example. Tungsten collector electrodes 28 and 30 include tungsten-silicon compound transition regions 36, and tungsten-silicon compounds 32 are physically and chemically bonded to, and form an integral part of, both the tungsten collector electrodes 28 and 30 and the silicon cell 20.

According to the method of the present invention, the formation of tungsten collector electrodes 28 and 30 on the silicon cell 20 involves the initial steps of masking the surface 25 of oxide passivated layer 34 to define the grid-like collector electrode configuration 28, and preparing the unmasked areas of surface 25 and surface 27*a* to receive the tungsten collector electrode material 28 and 30. The processes and techniques as described above with respect to the masking and preparation of silicon integrated circuit substrates or chips are equally applicable here. However, it is most important to note that only a few hundredths of a micron are removed from contact junction interfaces 29 during the roughening step due to PN junction 26 being only a few microns below surface 27.

Next tungsten collector material 28 and 30 is deposited on the unmasked surface areas 29 of cell 20. The deposition may be accomplished by a process of vacuum evaporation or other equivalent method as described above with respect to silicon integrated circuit substrate or chip 12. The deposits of tungsten 28 and 30 are relatively thick for solar cell collector electrodes, being in the order of a few microns thick. The thick deposits provide an X-ray shield for the underlying contact and silicon cell, strength for the electrode structure, sufficient tungsten to react completely with the available silicon, and a surface area sufficient to permit external leads 40 and 42 to be easily attached thereto.

Finally, the silicon cell 20, including tungsten collector electrodes 28 and 30, are annealed at temperatures in excess of 1,300° C. and preferably between 1,350° to 1,385° C., for periods of approximately from 5 to 20 minutes to form the reaction products of the tungsten and silicon in accordance with the present invention. As described above with respect to the silicon integrated circuit substrate chip 12, the annealing temperatures and time periods determine the depth, completeness, and uniformity to which the tungsten and silicon compounds 32 diffuse into the tungsten collectors and the silicon cell 20. The tungsten-silicon compound regions 36 will normally only extend several hundredths of a micron into the N-type skin 24 to avoid damaging PN junction 26.

Tungsten collector electrodes 28 and 30 formed on silicon solar cell 20 in accordance with the method of the present invention constitute reliable, ohmic, stable and temperature and radiation resistant contact electrodes. The novel process of the present invention permits tungsten contact electrodes to be formed on silicon substrates such as silicon solar cells and avoids the necessity of a subsequent passivation step to the silicon device. By obviating the subsequent passivation step, leads or electrical connections may be made directly to the tungsten collector electrodes because no cleaning steps are required to remove the insulating oxide layer normally formed on tungsten during a passivation step. Such techniques, for example, as inert gas welding, arc welding, resistance welding and soldering may be used to attach such leads. It also presents the possible automatic welding of large arrays of solar cells.

Certain steps of the method of the present invention may vary according to some of the techniques used, and according to the initial condition of the silicon semiconductor device.

For example, if the tungsten contact electrode material is deposited from a hot filament, at approximately 3,000° C., into a silicon device which is heated to a temperature in excess of 1,300° C., the annealing step will not be necessary because the interelemental compounds of tungsten and silicon will be formed during the deposition step. In this situation, the deposition step would be lengthened to permit a complete reaction to occur. However, if as described above, the deposition is onto a relatively cold silicon device, the annealing step is required to completely react the materials and form the tungsten silicon compounds.

It can thus be seen that a novel method of forming tungsten contact electrodes on silicon integrated circuit chips and silicon solar cells has been disclosed. The tungsten contact electrodes are formed on the silicon device by a process which reacts the tungsten with the silicon to form interelemental compounds of tungsten and silicon. The tungsten-silicon compounds are physically and chemically bonded to, and form an integral part of, both the tungsten contact electrode material and the silicon semiconductor material. The novel method does not require a subsequent passivation process or step which is normally required when the tungsten contact electrodes are formed on semiconductor devices. Leads may be directly attached to the tungsten electrode because no oxide insulating layers are present due to the avoidance of the subsequent passivation layer. The tungsten contact electrodes so produced are highly reliable, ohmic and stable low contact resistance electrodes which have not been produced by the prior art surface adhesive type contact electrode.

The above described specific embodiments are susceptible to numerous and varied modifications, all clearly within the spirited scope of the principles of the present invention, as will at once be apparent to those skilled in the art. No attempt has been made to illustrate exhaustively all such possibilities. For example, one such change could be the reversal of the P-and N- type dopants in the silicon solar cell 20 of FIGS. 2 and 3.

What is claimed is:

1. A method of forming a tungsten contact electrode on a passivated silicon substrate comprising the steps of:

a. masking said substrate to define a contact electrode configuration thereon;
b. preparing the unmasked areas of said substrate to receive said tungsten contact electrode;
c. depositing elemental tungsten on said unmasked areas of said substrate; and
d. heating said substrate at temperatures in excess of 1,300° C. for a period sufficiently long to form a sequence of said tungsten, a gradation of tungsten silicide compounds of differing molecular weights, and said silicon at said unmasked areas, said tungsten silicide compounds being physically and chemically bonded to, and forming an integral part of, both said deposited elemental tungsten and said silicon substrate.

2. The method of claim 1 wherein said contact electrode is a metallization electrode and said silicon substrate is a silicon integrated circuit substrate.

3. The method of claim 1 wherein said contact electrode is a collector electrode and said silicon substrate is a silicon solar cell.

4. The method of claim 1 comprising the further step of attaching an electrical lead directly to said deposited elemental tungsten.

5. The method of claim 1, wherein said elemental tungsten is deposited on said unmasked areas of said substrate at a temperature in excess of 3,000° C., while simultaneously heating said substrate to a temperature in excess of 1,300° C. and permitting said deposition to occur over a period of from 5 to 20 minutes.

6. The method of claim 1 wherein said heating step is an annealing function performed at a temperature between 1,350° and 1,385° C. for between 5 and 20 minutes.

7. A tungsten contact electrode for a silicon substrate comprising a tungsten electrode situated on a contact area of said silicon substrate to form an interface between said tungsten electrode and said silicon substrate, a gradation of tungsten silicide compounds of differing molecular weights in the region of said interface, said tungsten silicide compounds being physically and chemically bonded to, and forming an integral part of, both said tungsten electrode and said silicon substrate, and an electrical lead attached directly to said tungsten electrode.

8. A tungsten contact electrode for a silicon substrate as defined in claim 7 wherein said contact electrode is a metallization electrode and said silicon substrate is a silicon integrated circuit substrate.

9. A tungsten contact electrode for a silicon substrate as defined in claim 7 wherein said contact electrode is a collector electrode and said silicon substrate is a silicon solar cell.

10. A method of forming a tungsten contact electrode on a passivated silicon substrate having a mask thereon to define a contact electrode configuration and having been prepared to receive said tungsten contact electrode, comprising depositing elemental tungsten in said contact electrode configuration on said substrate and annealing said substrate with said deposited elemental tungsten at temperatures in excess of 1,300° C. for a period sufficiently long to form a gradation of tungsten silicide compounds of differing molecular weights, said tungsten silicide compounds being physically and chemically bonded to, and forming an integral part of, both said deposited elemental tungsten and said silicon substrate.

* * * * *